US012665394B2

(12) United States Patent
Zhou et al.

(10) Patent No.: US 12,665,394 B2
(45) Date of Patent: Jun. 23, 2026

(54) GEOMETRY FOR A SEMICONDUCTOR OPTICAL AMPLIFIER

(71) Applicant: Lumentum Operations LLC, San Jose, CA (US)

(72) Inventors: Yiyin Zhou, Santa Clara, CA (US); Amit Mizrahi, San Jose, CA (US); Michael C. Larson, Oakland, CA (US)

(73) Assignee: Lumentum Operations LLC, San Jose, CA (US)

( * ) Notice: Subject to any disclaimer, the term of this patent is extended or adjusted under 35 U.S.C. 154(b) by 1162 days.

(21) Appl. No.: 17/646,334

(22) Filed: Dec. 29, 2021

(65) Prior Publication Data

US 2023/0135027 A1 May 4, 2023

Related U.S. Application Data

(60) Provisional application No. 63/263,405, filed on Nov. 2, 2021.

(51) Int. Cl.
H01S 5/50 (2006.01)
H01S 5/10 (2021.01)

(52) U.S. Cl.
CPC .............. H01S 5/5009 (2013.01); H01S 5/10 (2013.01); H01S 5/1014 (2013.01)

(58) Field of Classification Search
None
See application file for complete search history.

(56) References Cited

U.S. PATENT DOCUMENTS

| | | | | |
|---|---|---|---|---|
| 2014/0301421 A1* | 10/2014 | Kanskar | ................ | H01S 5/2036 |
| | | | | 372/46.01 |
| 2015/0063392 A1* | 3/2015 | Takayama | ............. | H01S 5/0287 |
| | | | | 372/45.01 |
| 2023/0023686 A1* | 1/2023 | Leisher | ................... | H01S 5/509 |

OTHER PUBLICATIONS

El Yumin et al. "Taper-shape Dependence of Tapered-Waveguide Travelling Wave Semiconductor Laser Amplifier", IECE Transactions on Electronics, vol. E77-C, No. 4, Apr. 4, 1994. (Year: 1994).*
Bendelli et al., "A New Structure for High-Power TW-SLA," IEEE Photonics Technology Letters, vol. 3, No. 1, Jan. 1991, 3 Pages.
Bendelli et al., "Gain Saturation and Propagation Characteristics of Index-Guided Tapered-Waveguide Traveling-Wave Semiconductor Laser Amplifiers (TTW-SLA's)," IEEE Journal of Quantum Electronics, vol. 28 No. 2, Feb. 1992, 12 Pages.
Tijero et al., "Simulation and geometrical design of multi-section tapered semiconductor optical amplifiers at 1.57 μm," Conference Paper in Proceedings of SPIE—The International Society for Optical Engineering, May 2014, 8 Pages.
(Continued)

*Primary Examiner* — Eric L Bolda
(74) *Attorney, Agent, or Firm* — Harrity & Harrity, LLP

(57) ABSTRACT
In some implementations, a device may generate a data set including at least modal gain values and modal loss values for a semiconductor optical amplifier (SOA) slice. The device may determine, based on the data set, respective widths for a plurality of slices of an SOA using an autoregressive model. A width, of the respective widths, for a slice, of the plurality of slices, may be associated with a maximum conversion efficiency achievable for the slice at a given current density. The device may generate information indicating a geometry for the SOA based on the respective widths for the plurality of slices.

20 Claims, 11 Drawing Sheets

(56)     References Cited

OTHER PUBLICATIONS

Greene et al., "Modelling and Optimisation of the Static Saturation Characteristics of Quantum Well Semiconductor Optical Amplifiers," Proceedings of 8th International Conference on Indium Phosphide and Related Materials, Apr. 21-25, 1996, 6 Pages.

* cited by examiner

1010 — Generate a data set including at least modal gain values and modal loss values for an SOA slice 1020 — Determine, based on the data set, respective widths for a plurality of slices of an SOA using an autoregressive model 1030 — Generate information indicating a geometry for the SOA based on the respective widths for the plurality of slices

1000

GEOMETRY FOR A SEMICONDUCTOR OPTICAL AMPLIFIER

CROSS-REFERENCE TO RELATED APPLICATION

This patent application claims priority to U.S. Provisional Patent Application No. 63/263,405, filed on Nov. 2, 2021, and entitled "MAXIMUM EFFICIENCY GEOMETRY FOR SEMICONDUCTOR OPTICAL AMPLIFIERS." The disclosure of the prior application is considered part of and is incorporated by reference into this patent application.

TECHNICAL FIELD

The present disclosure relates generally to optical amplifiers and to a geometry for a semiconductor optical amplifier.

BACKGROUND

An optical amplifier is a device that is to receive signal light and generate amplified signal light (i.e., signal light with comparatively higher optical power). Typically, the optical amplifier provides optical amplification using a so-called gain medium, which is "pumped" (i.e., provided with energy) by a source, such as a pump laser or an electrical current source. In some cases, the optical amplifier may utilize a semiconductor as a gain medium (such a device may be referred to as a semiconductor optical amplifier).

SUMMARY

In some implementations, a method includes generating, by a device, a data set including at least modal gain values and modal loss values for a semiconductor optical amplifier (SOA) slice; determining, by the device and based on the data set, respective widths for a plurality of slices of an SOA using an autoregressive model, where a width, of the respective widths, for a slice, of the plurality of slices, is associated with a maximum conversion efficiency achievable for the slice at a given current density; and generating, by the device, information indicating a geometry for the SOA based on the respective widths for the plurality of slices.

In some implementations, an SOA device includes an SOA having a plurality of slices of respective widths, where a first slice, of the plurality of slices, precedes a second slice, of the plurality of slices, in a light propagation direction, where a first width of the first slice is associated with a maximum conversion efficiency achievable for the first slice at an input optical power to the first slice and at a given current density, the first width defining an output optical power from the first slice to the second slice, and where a second width of the second slice is associated with a maximum conversion efficiency achievable for the second slice at the output optical power from the first slice to the second slice and at the given current density.

In some implementations, an SOA device includes an SOA having an input end and an output end in a light propagation direction, where a section of the SOA, between the input end and the output end, has a taper that gradually increases in width in the light propagation direction, and where a slope of the taper decreases in the light propagation direction.

DETAILED DESCRIPTION

The following detailed description of example implementations refers to the accompanying drawings. The same reference numbers in different drawings may identify the same or similar elements.

High-power, high-efficiency semiconductor optical amplifiers (SOAs) may be used in light detection and ranging (LIDAR) and telecommunication applications. An SOA may provide an output optical power of about 150 milliwatts (mW) for an input optical power of about 20-30 mW. However, LIDAR applications may need an output optical power greater than 300 mW. Furthermore, as output optical power is increased, an efficiency of an SOA may decrease. In some examples, an SOA may be tapered (e.g., increasing in width from an input end to an output end) to improve the SOA's efficiency. Moreover, different types (e.g., geometries) of tapers, such as exponential tapers, may be employed in various SOAs. However, a taper for an SOA has not been designed to provide a highest possible efficiency, thereby degrading a performance of LIDAR or telecommunications using the SOA.

Some implementations described herein provide an SOA with an improved geometry that maximizes efficiency. In some implementations, a section of an SOA may have a taper having a slope that decreases, and a width that gradually increases, in a light propagation direction of the SOA. In some implementations, a technique for determining an optimized geometry for an SOA may utilize an autoregressive model based on a traveling wave technique. For example, the SOA may be conceptualized as a plurality of slices through which light propagates, and for each slice, a width may be determined that maximizes a conversion efficiency for the slice with respect to an input optical power to the slice. Pursuant to the autoregressive model, the input optical power to the slice may be an output optical power of a preceding slice (e.g., based on a width, and associated conversion efficiency, determined for the preceding slice).

Figure 1:
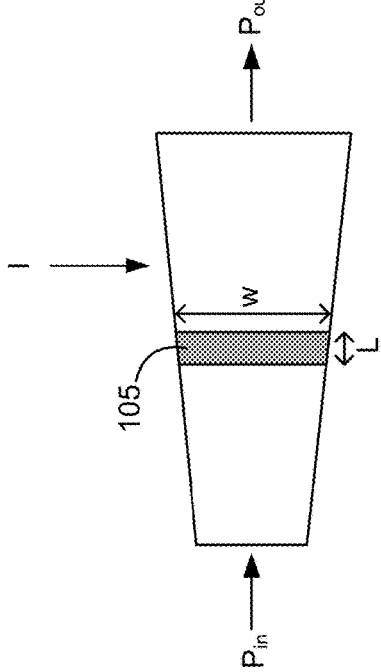
FIG. 1 is a diagram of a top view of an example semiconductor optical amplifier (SOA) that is tapered.

FIG. 1 is a diagram of a top view of an example SOA 100 that is tapered. An output optical power $P_{out}$ of the SOA 100 may be based on an input optical power $P_{in}$ to the SOA 100 and a current I applied to the SOA 100. The current I is related to a current density J of the SOA 100, and the current density J may be assumed to be uniform across a cross-section of the SOA 100. The conversion efficiency (i.e., power added efficiency) $\eta$ of a slice 105 of the SOA, having a length L and a width w, may be determined according to Equation 1:

$$\eta = \frac{P_{out} - P_{in}}{IV} = \frac{P_{in}\exp[(G - \alpha)L] - P_{in}}{(JwL)V} = \frac{P_{in}\{\exp[(G - \alpha)L] - 1\}}{(JwL)V} \qquad \text{Equation 1}$$

where V is a voltage applied to the SOA 100, G is a modal gain value, and a is a modal loss value. Moreover, a local conversion efficiency $\eta_{local}$ of the SOA 100 (e.g., for a slice of the SOA 100 of infinitesimally small length) may be determined according to Equation 2:

$$\eta_{local} = \lim_{L \to 0} \eta = \frac{1}{JV} \qquad \text{Equation 2}$$

where P is a local optical power. As described herein, at a given current density J and optical power P, there may be a width of the slice 105 of the SOA 100 associated with a maximum local conversion efficiency.

As indicated above, FIG. 1 is provided as an example. Other examples may differ from what is described with regard to FIG. 1.

Figure 2A:
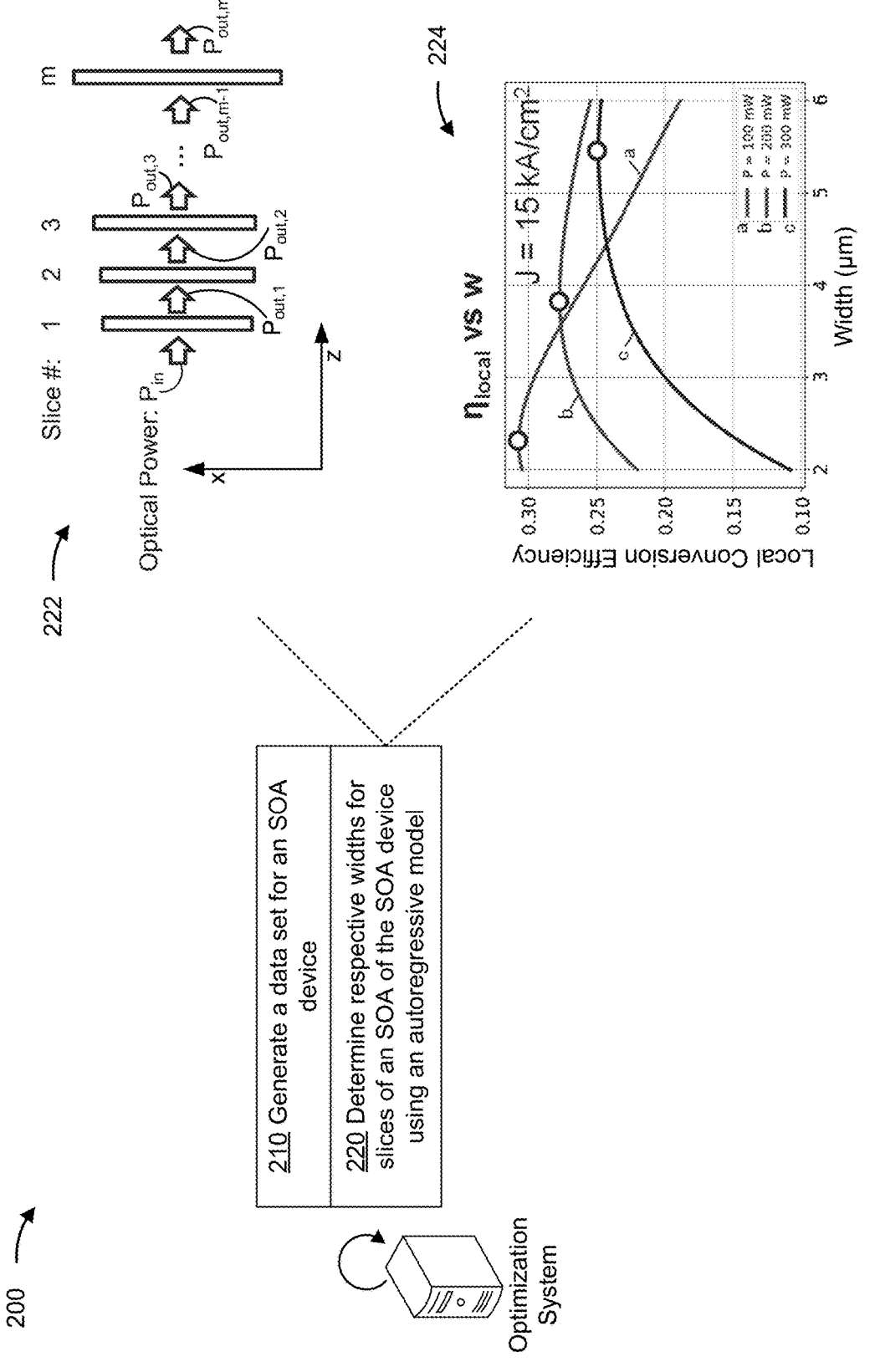
FIGS. 2A-2B are diagrams of an example associated with optimizing a geometry for an SOA.
Figure 2B:
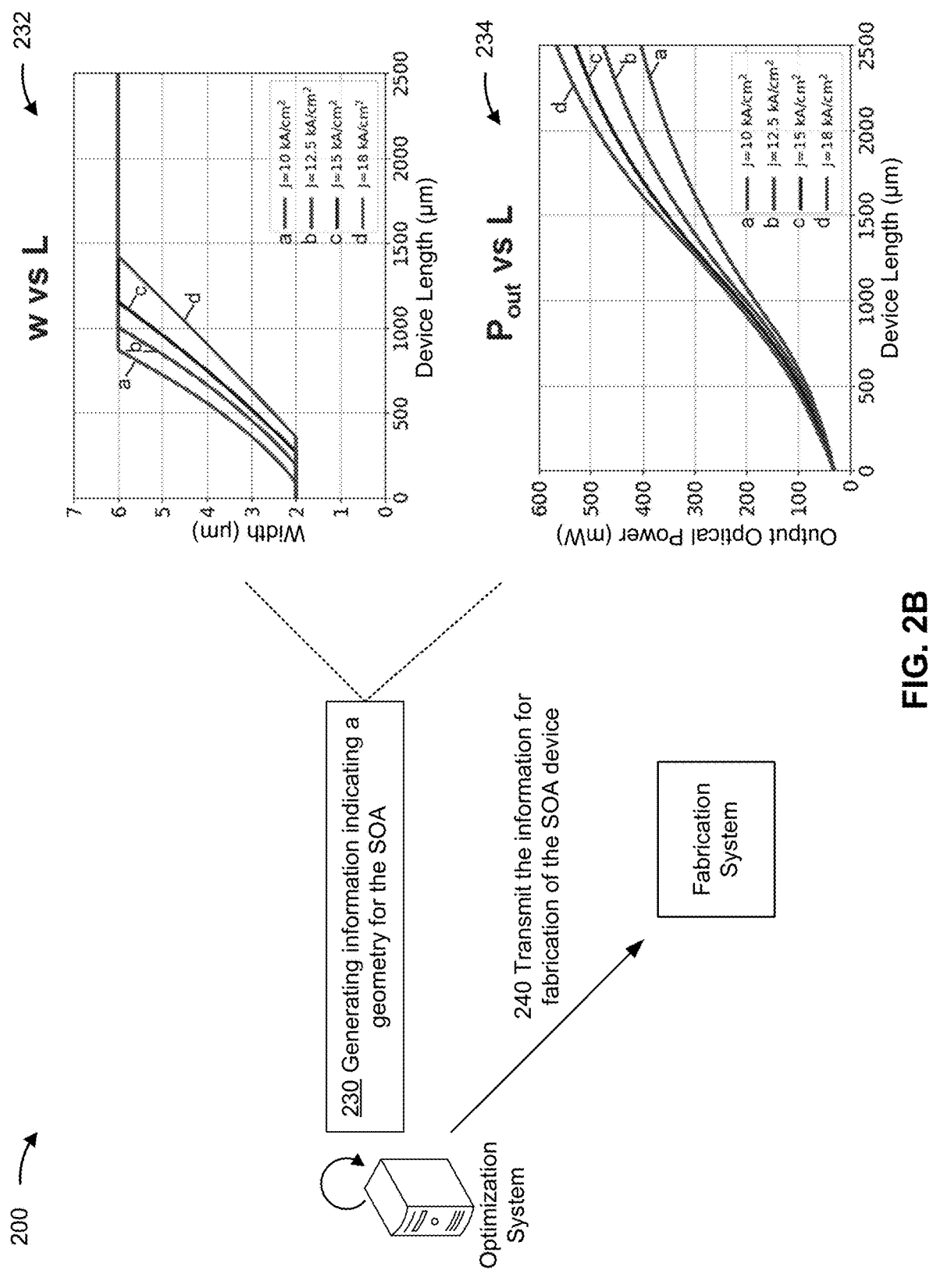

FIGS. 2A-2B are diagrams of an example 200 associated with optimizing a geometry for an SOA. As shown in FIGS. 2A-2B, example 200 includes an optimization system and a fabrication system. These devices are described in more detail in connection with FIGS. 8 and 9.

As shown in FIG. 2A, and by reference number 210, the optimization system may generate a data set for an SOA device (e.g., for one or more slices of the SOA device). The SOA device may include an SOA (e.g., a waveguide, such as a ridge waveguide). Moreover, the SOA device may include a particular epitaxial structure (e.g., a particular semiconductor layer stack), as described below. The data set may include at least modal gain values (G values) and modal loss values (a values) for the SOA device (e.g., for a region of the SOA device). In some implementations, the data set may include temperature values for the SOA device. At a given current density J, the modal gain values, modal loss values, and/or temperature values may be associated with a plurality of SOA widths w and/or a plurality of input optical powers P (e.g., an $i^{th}$ G value may be represented as $G_i(w_i, J, P_i)$ and an $i^{th}$ $\alpha$ value may be represented as $\alpha_i(w_i, J, P_i)$). The optimization system may generate the data set using a laser simulation model (e.g., a laser solver) configured to output a quantitative characterization for an epitaxial structure (e.g., an SOA device epitaxial structure). The optimization system may generate the data set prior to determining a width for the SOA, or the optimization system may generate the data set in an ongoing manner in connection with determining the width for the SOA.

As shown by reference number 220, the optimization system may determine, based on the data set, respective widths for a plurality of slices of the SOA of the SOA device using an autoregressive model. A "slice" of the SOA may refer to a segment of the SOA having a length in a light propagation direction of the SOA, along the z-axis shown, and a width in a direction transverse to the light propagation direction (e.g., a ridge width of the SOA), along the x-axis shown. Each slice of the SOA may have the same length and height, while different slices of the SOA may have different widths, as described herein. In some implementations, the length used for slices of the SOA may be configured to any value greater than zero. As the length used for the slices approaches zero (e.g., the length is infinitesimally small), the respective widths determined using the autoregressive model define an increasingly smooth curve for the geometry of the SOA.

Using the autoregressive model, the optimization system may determine a width for a subsequent slice of the SOA based on an optical power associated with a width determined for a previous slice of the SOA. In an example with a first slice of the SOA that immediately precedes a second slice of the SOA in the light propagation direction, the autoregressive model may use an output optical power associated with a first width determined for the first slice as an input optical power for determining a second width for the second slice. In other words, the autoregressive model may use a traveling wave technique to determine the respective widths for the plurality of slices (e.g., as light propagates through the SOA, the width for each slice is determined slice by slice).

Reference number 222 shows an example of the traveling-wave technique of the autoregressive model. Here, the optimization system may initialize the autoregressive model with a starting input optical power $P_{in}$. A value of $P_{in}$ may be configured, arbitrary, based on specifications of the SOA device, or the like. The optimization system, using the autoregressive model and based on the input optical power $P_{in}$ and the data set, may determine a width for a first slice (shown as slice 1) of the SOA that maximizes a conversion efficiency (e.g., a local conversion efficiency) for the first slice. For example, as illustrated by plot 224, for a given current density J, the optimization system may determine (e.g., using Equation 2 above) conversion efficiencies for the first slice at various widths based on the starting input optical power $P_{in}$ and using local modal gain value(s) and local modal loss value(s) from the data set. Continuing with the example, the optimization system may determine the width for the first slice that is associated with a maximum conversion efficiency of the conversion efficiencies determined for the first slice. Moreover, the optimization system may determine (e.g., using Equation 1 above) an output optical power $P_{out,1}$ of the first slice based on the width determined for the first slice.

For a second slice (shown as slice 2) of the SOA, the optimization system, using the autoregressive model and based on the output optical power $P_{out,1}$ of the first slice (in other words, an input optical power to the second slice) and the data set, may determine a width for the second slice that maximizes a conversion efficiency (e.g., a local conversion efficiency) for the second slice, in a similar manner as described above. For example, for the given current density J, the optimization system may determine (e.g., using Equation 2 above) conversion efficiencies for the second slice at various widths based on the output optical power $P_{out,1}$ of the first slice and using local modal gain value(s) and local modal loss value(s) from the data set. Continuing with the example, the optimization system may determine the width for the second slice that is associated with a maximum conversion efficiency of the conversion efficiencies determined for the second slice. Moreover, the optimization system may determine (e.g., using Equation 1 above) an output optical power $P_{out,2}$ of the second slice based on the width determined for the second slice.

The optimization system may use the output optical power $P_{out,2}$ to determine a width for a third slice of the SOA, and so forth for each slice of the SOA. In other words, from the first slice to a last slice in the light propagation direction, a width and an optical power for each slice is determined autoregressively using the autoregressive model. In particular, the optimization system determines an optimal width (e.g., associated with a maximum conversion efficiency) for each slice based on an input optical power to the slice (i.e., an output optical power of a preceding slice) and determines an output optical power from the slice based on the optimal width.

Thus, using the autoregressive model, a width that is determined for a slice of the SOA may be associated with a maximum conversion efficiency for the slice at a given input optical power and at a given current density. For example, each slice of the SOA may have a width associated with a maximum conversion efficiency achievable for the slice at a local optical power for the slice and at a given current density. However, in some implementations, widths of the slices may be constrained by a minimum width and/or a maximum width (e.g., to avoid an unstable far field), such that a width for a slice may be the minimum width or the maximum width rather than a width associated with a maximum conversion efficiency. Accordingly, the optimization system may increase a width that is determined for a slice to a minimum width (e.g., a minimum width configured for the optimization system) and/or the optimization system may decrease a width that is determined for a slice to the maximum width (e.g., a maximum width configured for the optimization system).

The geometry for the SOA may be based on the respective widths determined for the plurality of slices of the SOA. That is, the respective widths define a curve that indicates the geometry for the SOA. Moreover, the geometry for the SOA, determined using the autoregressive model, may be associated with a maximum conversion efficiency that is achievable for the SOA or the SOA device (e.g., rather than merely a high conversion efficiency). Relative to an exponential taper, the geometry described herein provides higher device conversion efficiency and less aggressive width expansion at the same target output power.

As shown in FIG. 2B, and by reference number 230, the optimization system may generate information indicating a geometry for the SOA. The information may be in the form of a data set, a plot, or the like. In some implementations, the information may indicate a width for the SOA with respect to a length of the SOA, as shown by plot 232 (in which the slices of the SOA are constrained by a minimum width and a maximum width). In some implementations, the information may indicate an output optical power of the SOA with respect to a length of the SOA, as shown by plot 234.

In some implementations, the optimization system, using the autoregressive model in the manner described above, may determine respective widths for the plurality of slices of the SOA at multiple current density values, as shown by plot 232. Here, the optimization system may select a current density and corresponding geometry for the SOA that is associated with a maximum output optical power, a target output optical power, or the like, in accordance with plot 234. For example, the optimization system may determine a particular current density and/or a particular SOA length that is to be used for the SOA based on a target output optical power for the SOA.

In some implementations, the SOA device may be fabricated based on the information indicating the geometry for the SOA. For example, as shown by reference number 240, the optimization system may transmit the information to another device, such as a fabrication system (e.g., an epitaxy system and/or a semiconductor lithography system), for fabrication of the SOA device. Fabrication of the SOA device may include defining the geometry for the SOA in lithography mask sets and/or processing semiconductor using lithography, etching, and/or epitaxial growth steps, among other examples.

In this way, the optimization system may determine a geometry for the SOA that has a highest possible conversion efficiency as optical power changes from an input optical power $P_{in}$ to the SOA device to an output optical power $P_{out}$ of the SOA device. The local power for the SOA device may be expressed using Equation 3:

$$P_{IV,local} = \frac{dP}{\eta_{local}} \qquad \text{Equation 3}$$

where $P_{IV,local}$ is the local electrical power consumption (current×voltage) for an SOA slice and dP is a change in power. A total power of the SOA device is an integral over the local power, as shown by Equation 4:

$$P_{IV,device} = \int_{P_{in}}^{P_{out}} \frac{dP}{\eta_{local}} = \frac{P_{out} = P_{in}}{\eta_{device}} \qquad \text{Equation 4}$$

Thus, using the autoregressive model, the optimization system determines a minimum local electrical power ($P_{IV,local}$) in the entire range from $P_{in}$ to $P_{out}$. Accordingly, an optimal SOA device may have a smallest total power consumption integrated area ($P_{IV,device}$), or stated differently, may have a maximum device conversion efficiency ($\eta_{device}$) among possible geometries.

In some implementations, an SOA device (e.g., that is fabricated in accordance with a geometry determined using the autoregressive model) may include an SOA having a plurality of slices of respective widths. Here, the plurality of slices of the SOA are conceptual slices (e.g., segments of the SOA), and in practice the SOA is continuous. The plurality of slices of the SOA may include a first slice and a second slice, and the first slice may precede the second slice in the light propagation direction.

The first slice may have a first width associated with a maximum conversion efficiency (e.g., according to Equation 2 above) achievable for the first slice (e.g., based on the particular epitaxial structure of the SOA device, which defines modal gain values and modal loss values, as described above) at a given current density and at an input optical power to the first slice (e.g., an input optical power to the SOA if there is no slice preceding the first slice or an output optical power from a slice immediately preceding the first slice). The first width for the first slice may define an output optical power from the first slice to the second slice (e.g., an output optical power from the first slice may be determined based on an input optical power to the first slice and the first width for the first slice). The second slice may have a second width associated with a maximum conversion efficiency achievable for the second slice (e.g., based on the particular epitaxial structure of the SOA device) at the given current density and at the output optical power from the first slice to the second slice (i.e., an input optical power to the second slice).

The plurality of slices of the SOA may include additional slices in a similar manner as described above. For example, the plurality of slices may include a third slice that immediately follows the second slice in the light propagation direction. The third slice may have a third width associated with a maximum conversion efficiency achievable for the third slice at the given current density and at an output optical power from the second slice to the third slice (i.e., an input optical power to the third slice). Thus, each slice of the SOA may have a width associated with a maximum conversion efficiency at a local optical power for the slice. In other words, for every slice of the SOA, a conversion efficiency is at a maximum with respect to waveguide width and local optical power.

As indicated above, FIGS. 2A-2B are provided as an example. Other examples may differ from what is described with regard to FIGS. 2A-2B.

Figure 3:
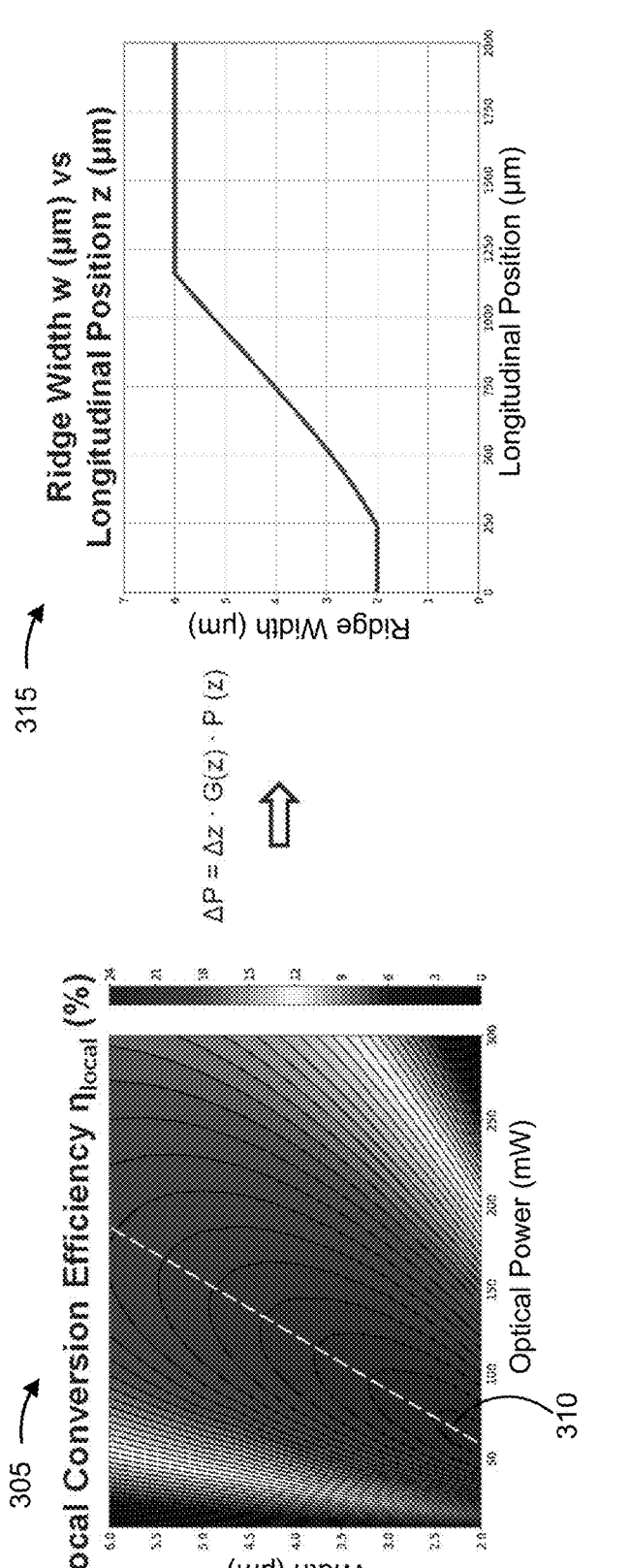
FIG. 3 is a diagram of an example illustrating a relationship between conversion efficiency, width, and length for an SOA.

FIG. 3 is a diagram of an example 300 illustrating a relationship between conversion efficiency, width, and length for an SOA. Plot 305 shows contours of the local conversion efficiency as a function of optical power and SOA width ($\eta_{local}$(P,w)) at a given current density. The optimal SOA width follows the maximum conversion efficiency as shown by line 310. A relationship between optical power and SOA longitudinal position (e.g., position in the light propagation direction) is defined by Equation 5:

$$\Delta P = \Delta z \cdot G(z) \cdot P(z) \qquad \text{Equation 5}$$

where z represents a longitudinal position of the SOA. Using Equation 5, the optimal SOA width indicated by plot 305 may be converted to longitudinal position of the SOA, as shown by plot 315.

In some implementations, the optimization system may employ the technique described in connection with FIG. 3 in addition to, or as an alternative to, the technique described in connection with FIGS. 2A-2B (e.g., the technique described in connection with FIG. 3 is an alternative expression of the technique described in connection with FIGS. 2A-2B, and therefore will produce the same outcome). For example, the optimization system may generate a contour plot (e.g., plot 305) for the local conversion efficiency of an SOA of an SOA device at a given current density. Based on the contour plot, the optimization system may determine width and optical power data points corresponding to a maximum conversion efficiency (e.g., line 310). Based on the width and optical power data points, the optimization system may determine (e.g., using Equation 5) widths for the SOA at a plurality of longitudinal positions of the SOA. Moreover, the optimization system may generate information indicating a geometry for the SOA based on the widths at the plurality of longitudinal positions. For example, the optimization system may generate a plot of width versus longitudinal position of the SOA (e.g., plot 315). In some implementations, an SOA device may be fabricated based on the information indicating the geometry for the SOA, in a similar manner as described in connection with FIGS. 2A-2B.

As indicated above, FIG. 3 is provided as an example. Other examples may differ from what is described with regard to FIG. 3.

Figure 4:
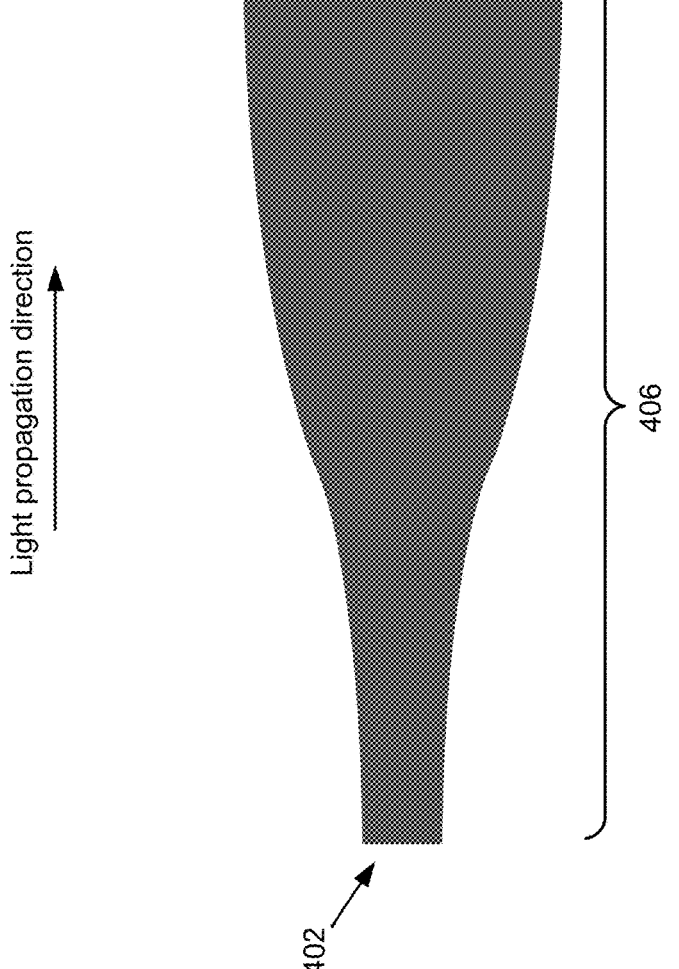
FIGS. 4-7 are diagrams of top views of example SOAs of SOA devices.

FIG. 4 is a diagram of a top view of an example SOA 400 of an SOA device. The SOA 400 has an input end 402 and an output end 404 in a light propagation direction. The SOA 400 may include a section 406 between the input end 402 and the output end 404. The section 406 may extend from the input end 402 to the output end 404 of the SOA 400, as shown in FIG. 4.

The section 406 of the SOA 400 may have a taper that gradually increases in width in the light propagation direction. For example, the taper may nonlinearly increase in width in the light propagation direction. Moreover, a slope of the taper may decrease (e.g., linearly or nonlinearly) in the light propagation direction. For example, the taper may include a convex curve (e.g., relative to an axis of the SOA defined by the light propagation direction). The taper may define a geometry for the SOA that is associated with a maximum conversion efficiency that is achievable for the SOA device, as described herein.

As indicated above, FIG. 4 is provided as an example. Other examples may differ from what is described with regard to FIG. 4.

Figure 5:
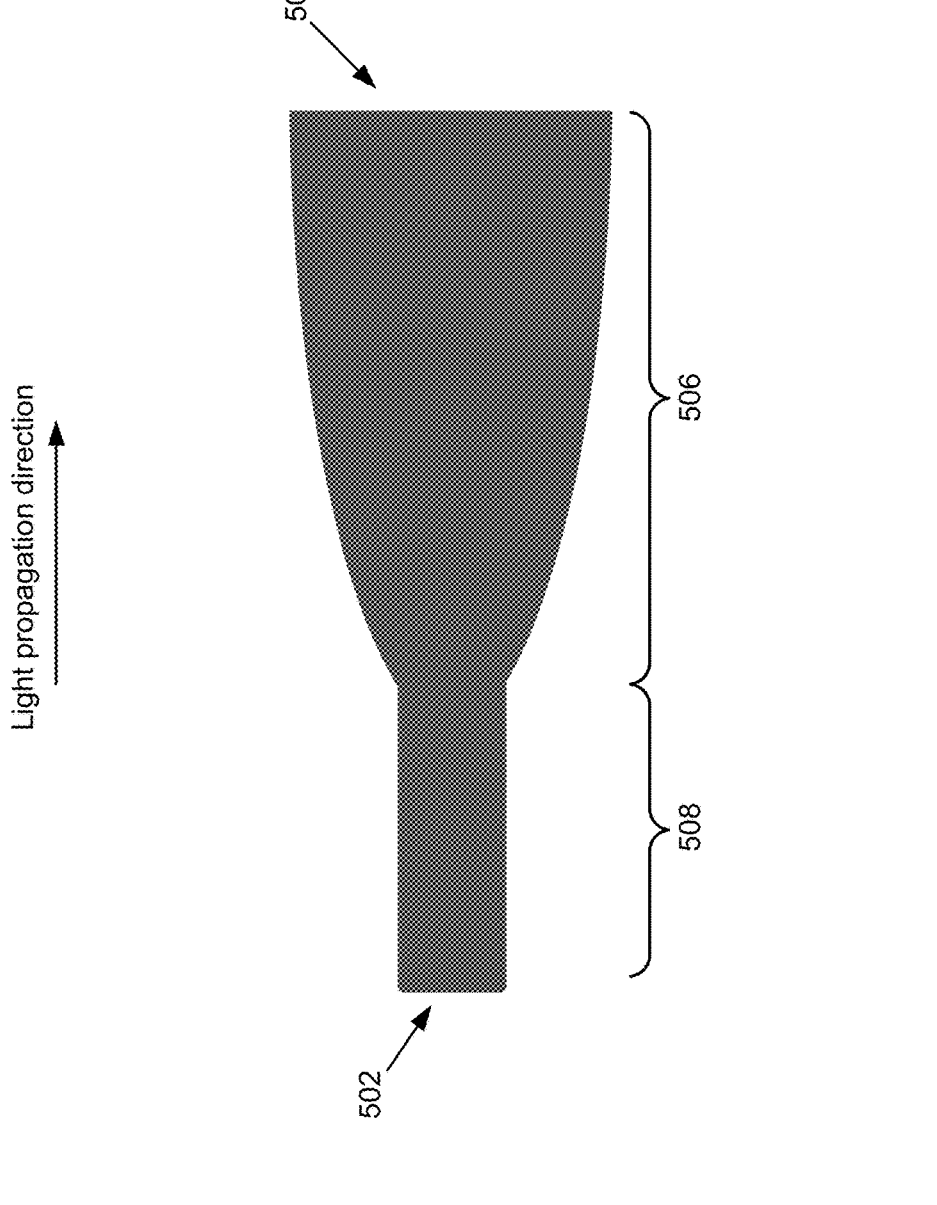

FIG. 5 is a diagram of a top view of an example SOA 500 of an SOA device. The SOA 500 has an input end 502 and an output end 504 in a light propagation direction. The SOA 500 may include a section 506 between the input end 502 and the output end 504. The section 506 may extend from a position proximally distanced from the input end 502 to the output end 504 of the SOA 500, as shown in FIG. 5. The section 506 of the SOA 500 may have a taper as described in connection with FIG. 4 (e.g., the taper may gradually increase in width and decrease in slope in the light propagation direction).

The SOA 500 may include an input section 508. The input section 508 may extend from the input end 502 to the section 506 of the SOA 500. In some implementations, the input section 508 may have a constant width in the light propagation direction. That is, the input width of the SOA 500 may be capped (i.e., constrained by a minimum width).

As indicated above, FIG. 5 is provided as an example. Other examples may differ from what is described with regard to FIG. 5.

Figure 6:
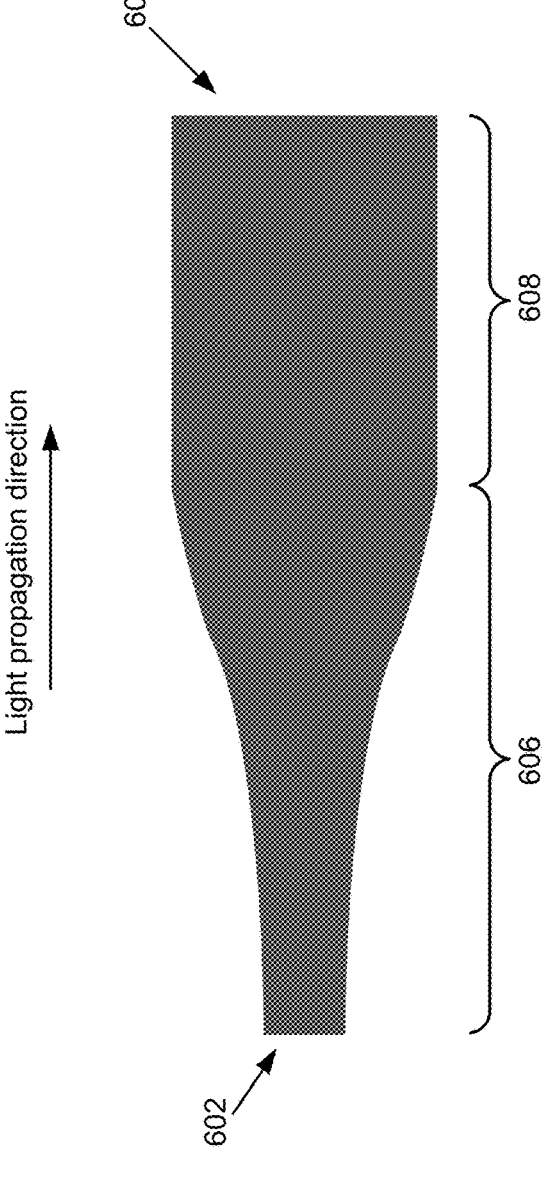

FIG. 6 is a diagram of a top view of an example SOA 600 of an SOA device. The SOA 600 has an input end 602 and an output end 604 in a light propagation direction. The SOA 600 may include a section 606 between the input end 602 and the output end 604. The section 606 may extend from the input end 602 to a position proximally distanced from the output end 604 of the SOA 600, as shown in FIG. 6. The section 606 of the SOA 600 may have a taper as described in connection with FIG. 4 (e.g., the taper may gradually increase in width and decrease in slope in the light propagation direction).

The SOA 600 may include an output section 608. The output section 608 may extend from the section 606 to the output end 604 of the SOA 600. In some implementations, the output section 608 may have a constant width in the light propagation direction. That is, the output width of the SOA 600 may be capped (i.e., constrained by a maximum width).

As indicated above, FIG. 6 is provided as an example. Other examples may differ from what is described with regard to FIG. 6.

Figure 7:
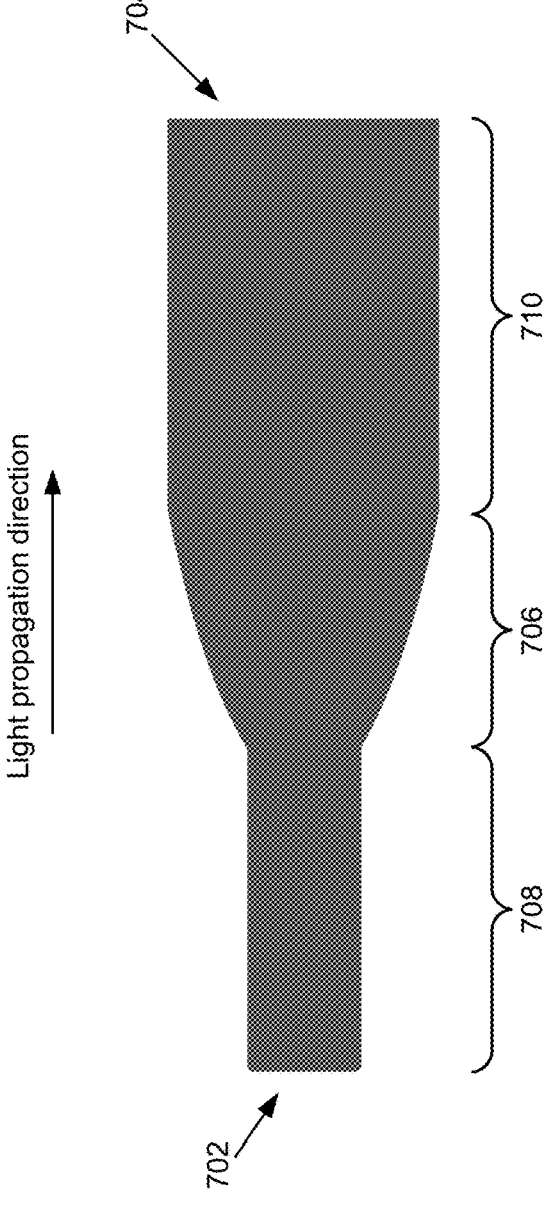

FIG. 7 is a diagram of a top view of an example SOA 700 of an SOA device. The SOA 700 has an input end 702 and an output end 704 in a light propagation direction. The SOA 700 may include a section 706 between the input end 702 and the output end 704. The section 706 may extend from a position proximally distanced from the input end 702 to a position proximally distanced from the output end 704 of the SOA 700, as shown in FIG. 7. The section 706 of the SOA 700 may have a taper as described in connection with FIG. 4 (e.g., the taper may gradually increase in width and decrease in slope in the light propagation direction).

The SOA 700 may include an input section 708 as described in connection with FIG. 5 (e.g., the input section 708 may have a constant width in the light propagation direction). The SOA 700 may also include an output section 710 as described in connection with FIG. 6 (e.g., the output section 710 may have a constant width in the light propagation direction).

As indicated above, FIG. 7 is provided as an example. Other examples may differ from what is described with regard to FIG. 7.

An SOA device described herein (e.g., in connection with FIGS. 2A-2B, 3, 4, 5, 6, and/or 7) may be an edge emitting device or a vertically emitting device. The SOA device may include an epitaxial structure (e.g., including a substrate and one or more active regions) that includes an SOA (e.g., a ridge waveguide) described herein. The SOA device may also include one or more electrodes, metal contacts, or the like. The SOA device may additionally include an antireflection coating at end faces of the epitaxial structure.

Figure 8:
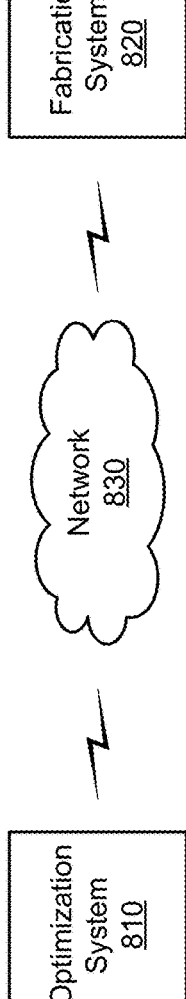
FIG. 8 is a diagram of an example environment in which systems and/or methods described herein may be implemented.

FIG. 8 is a diagram of an example environment 800 in which systems and/or methods described herein may be implemented. As shown in FIG. 8, environment 800 may include an optimization system 810, a fabrication system 820, and a network 830. Devices of environment 800 may interconnect via wired connections, wireless connections, or a combination of wired and wireless connections.

The optimization system 810 includes one or more devices capable of receiving, generating, storing, processing, providing, and/or routing information associated with a geometry for an SOA, as described elsewhere herein. For example, the optimization system 810 may implement the autoregressive model, as described elsewhere herein. The optimization system 810 may include a communication device and/or a computing device. For example, the optimization system 810 may include a server, such as an application server, a client server, a web server, a database server, a host server, a virtual server (e.g., executing on computing hardware), or a server in a cloud computing system. In some implementations, the optimization system 810 includes computing hardware used in a cloud computing environment.

The fabrication system 820 includes one or more devices capable of receiving, generating, storing, processing, providing, and/or routing information associated with fabrication of an SOA in accordance with a particular geometry, as described elsewhere herein. The fabrication system 820 may be an epitaxy system and/or a semiconductor lithography system. The fabrication system 820 may include a communication device and/or a computing device. For example, the fabrication system 820 may include a server, such as an application server, a client server, a web server, a database server, a host server, a virtual server (e.g., executing on computing hardware), or a server in a cloud computing system. In some implementations, the fabrication system 820 includes computing hardware used in a cloud computing environment.

The network 830 includes one or more wired and/or wireless networks. For example, the network 830 may include a wireless wide area network (e.g., a cellular network or a public land mobile network), a local area network (e.g., a wired local area network or a wireless local area network (WLAN), such as a Wi-Fi network), a personal area network (e.g., a Bluetooth network), a near-field communication network, a telephone network, a private network, the Internet, and/or a combination of these or other types of networks. The network 830 enables communication among the devices of environment 800.

The number and arrangement of devices and networks shown in FIG. 8 are provided as an example. In practice, there may be additional devices and/or networks, fewer devices and/or networks, different devices and/or networks, or differently arranged devices and/or networks than those shown in FIG. 8. Furthermore, two or more devices shown in FIG. 8 may be implemented within a single device, or a single device shown in FIG. 8 may be implemented as multiple, distributed devices. Additionally, or alternatively, a set of devices (e.g., one or more devices) of environment 800 may perform one or more functions described as being performed by another set of devices of environment 800.

Figure 9:
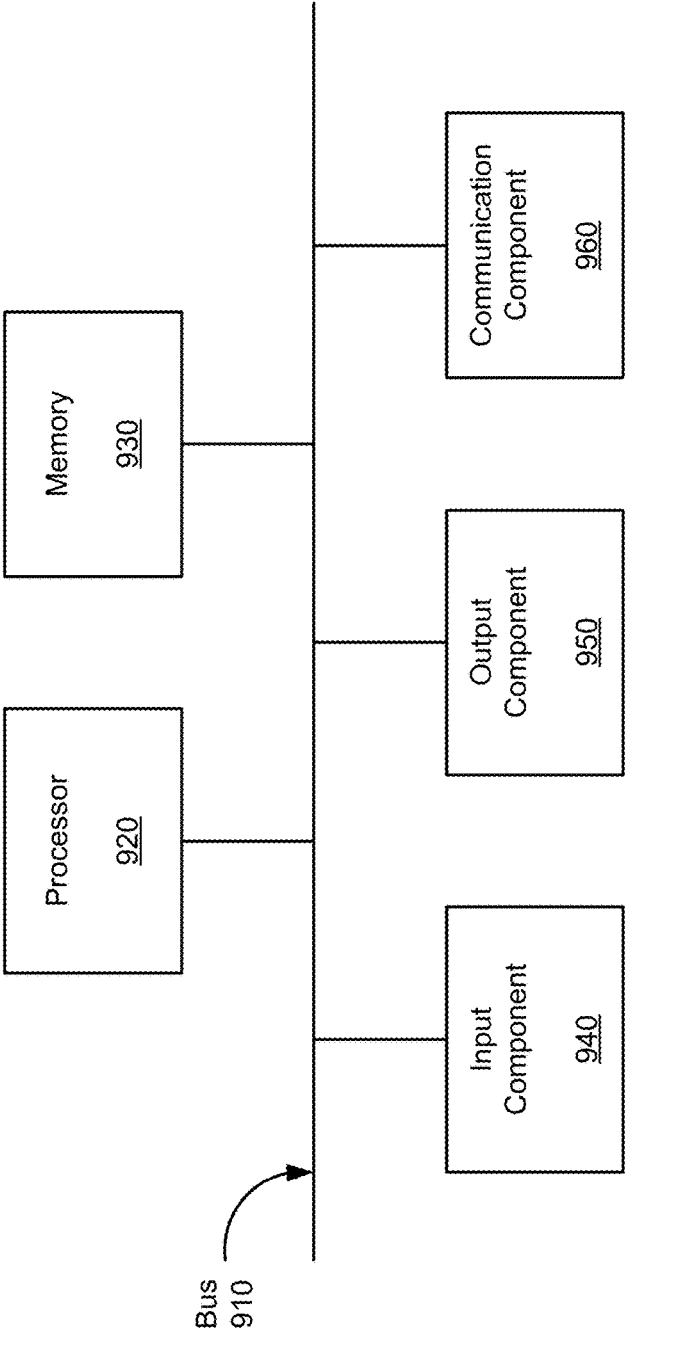
FIG. 9 is a diagram of example components of one or more devices of FIG. 8.

FIG. 9 is a diagram of example components of a device 900, which may correspond to optimization system 810 and/or fabrication system 820. In some implementations, optimization system 810 and/or fabrication system 820 includes one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
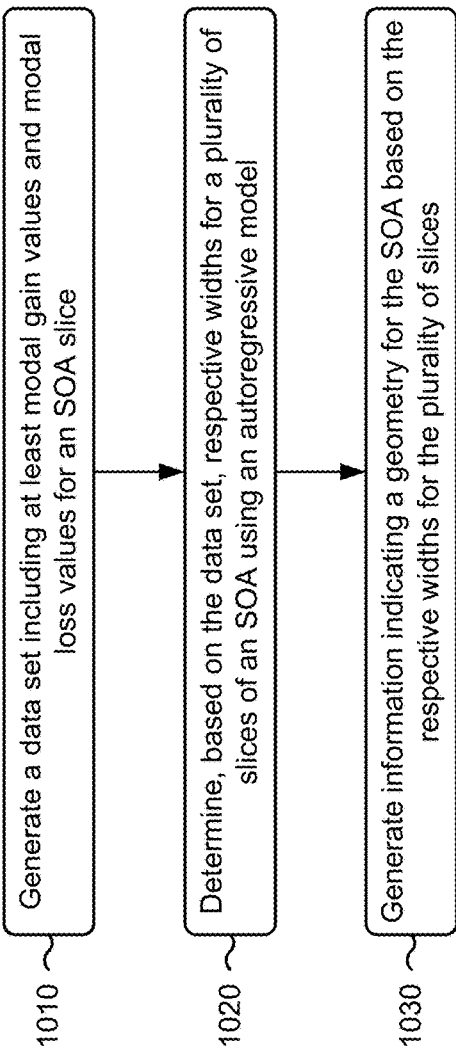
FIG. 10 is a flowchart of an example process associated with optimizing a geometry for an SOA.
Figure 10:

FIG. 10 is a flowchart of an example process 1000 associated with optimizing a geometry for an SOA. In some implementations, one or more process blocks of FIG. 10 are performed by a device (e.g., optimization system 810). In some implementations, one or more process blocks of FIG. 10 are performed by another device or a group of devices separate from or including the device, such as a fabrication system (e.g., fabrication system 820). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include generating a data set including at least modal gain values and modal loss values for an SOA slice (block 1010). For example, the device may generate a data set including at least modal gain values and modal loss values for an SOA slice, as described above.

As further shown in FIG. 10, process 1000 may include determining, based on the data set, respective widths for a plurality of slices of an SOA using an autoregressive model (block 1020). For example, the device may determine, based on the data set, respective widths for a plurality of slices of an SOA using an autoregressive model. In some implementations, a width, of the respective widths, for a slice, of the plurality of slices, is associated with a maximum conversion efficiency achievable for the slice at a given current density.

As further shown in FIG. 10, process 1000 may include generating information indicating a geometry for the SOA based on the respective widths for the plurality of slices (block 1030). For example, the device may generate information indicating a geometry for the SOA based on the respective widths for the plurality of slices, as described above.

Process 1000 may include additional implementations, such as any single implementation or any combination of implementations described below and/or in connection with one or more other processes described elsewhere herein.

In a first implementation, the autoregressive model uses a traveling wave technique.

In a second implementation, alone or in combination with the first implementation, the autoregressive model uses an output optical power associated with a first width, of the respective widths, determined for a first slice, of the plurality of slices, as an input optical power for determining a second width, of the respective widths, for a second slice of the plurality of longitudinal slices.

In a third implementation, alone or in combination with one or more of the first and second implementations, the respective widths for the plurality of slices are associated with respective maximum conversion efficiencies achievable for the plurality of slices at the given current density.

In a fourth implementation, alone or in combination with one or more of the first through third implementations, an SOA device is fabricated based on the information indicating the geometry for the SOA.

In a fifth implementation, alone or in combination with one or more of the first through fourth implementations, process 1000 includes transmitting the information indicating the geometry for the SOA to another device for fabrication of an SOA device.

In a sixth implementation, alone or in combination with one or more of the first through fifth implementations, the slice has a length in a light propagation direction of the SOA and a width in a direction transverse to the light propagation direction.

In a seventh implementation, alone or in combination with one or more of the first through sixth implementations, the geometry for the SOA is associated with a maximum conversion efficiency achievable for the SOA.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor optical amplifier (SOA) device, comprising:
   an SOA having a plurality of slices of respective widths,
      wherein a first slice, of the plurality of slices, precedes a second slice, of the plurality of slices, in a light propagation direction,
      wherein a first width of the first slice is associated with a maximum conversion efficiency achievable for the first slice at an input optical power to the first slice and at a given current density, the first width defining an output optical power from the first slice to the second slice, and
      wherein a second width of the second slice is associated with a maximum conversion efficiency achievable for the second slice at an input optical power to the second slice and at the given current density,
         wherein the input optical power to the second slice is the output optical power from the first slice to the second slice.

2. The SOA device of claim 1, wherein each slice, of the plurality of slices, has a width associated with a maximum conversion efficiency achievable for the slice at a local optical power for the slice and at the given current density.

3. The SOA device of claim 1, wherein a slice, of the plurality of slices, has a length in a light propagation direction of the SOA and a width in a direction transverse to the light propagation direction.

4. The SOA device of claim 1, wherein the respective widths for the plurality of slices define a geometry for the SOA that is associated with a maximum conversion efficiency achievable for the SOA device.

5. The SOA device of claim 1, wherein the SOA has an input end and an output end in a light propagation direction,
   wherein a section of the SOA, between the input end and the output end, has a taper that gradually increases in width in the light propagation direction, and
   wherein a slope of the taper decreases in the light propagation direction.

6. A semiconductor optical amplifier (SOA) device, comprising:
   an SOA having an input end and an output end in a light propagation direction,
      wherein a section of the SOA, between the input end and the output end, has a taper that gradually increases in width in the light propagation direction, and
      wherein a slope of the taper decreases in the light propagation direction.

7. The SOA device of claim 6, wherein the taper nonlinearly increases in width in the light propagation direction.

8. The SOA device of claim 6, wherein the taper includes a convex curve relative to an axis of the SOA defined by the light propagation direction.

9. The SOA device of claim 6, wherein the SOA includes an input section, extending from the input end to the section, that has a constant width in the light propagation direction.

10. The SOA device of claim 6, wherein the SOA includes an output section, extending from the section to the output end, that has a constant width in the light propagation direction.

11. The SOA device of claim 6, wherein the SOA includes:
   an input section, extending from the input end to the section, that has a constant width in the light propagation direction, and
   an output section, extending from the section to the output end, that has a constant width in the light propagation direction.

12. The SOA device of claim 6, wherein the taper defines a geometry for the SOA that is associated with a maximum conversion efficiency achievable for the SOA device.

13. An apparatus, comprising:
   a semiconductor optical amplifier (SOA),
      wherein a first slice of the SOA precedes a second slice of the SOA, in a light propagation direction,
      wherein a first width of the first slice is associated with a maximum conversion efficiency achievable for the first slice at an input optical power to the first slice and at a given current density, the first width defining an output optical power from the first slice to the second slice, and
      wherein a second width of the second slice is associated with a maximum conversion efficiency achievable for the second slice at an input optical power to the second slice,
         wherein the input optical power to the second slice is the output optical power from the first slice to the second slice.

14. The apparatus of claim 13, wherein each slice, of the plurality of slices, has a width associated with a maximum conversion efficiency achievable for the slice at a local optical power for the slice and at the given current density.

15. The apparatus of claim 13, wherein a slice, of the plurality of slices, has a length in a light propagation direction of the SOA and a width in a direction transverse to the light propagation direction.

16. The apparatus of claim 13, wherein the respective widths for the plurality of slices define a geometry for the SOA that is associated with a maximum conversion efficiency achievable for the apparatus.

17. The apparatus of claim 13, wherein the SOA has an input end and an output end in a light propagation direction,
   wherein a section of the SOA, between the input end and the output end, has a taper that gradually increases in width in the light propagation direction, and
   wherein a slope of the taper decreases in the light propagation direction.

18. The apparatus of claim 13, wherein a section of the SOA, between the input end and the output end, has a taper that gradually increases in width in the light propagation direction, and
   wherein a slope of the taper decreases in the light propagation direction.

19. The apparatus of claim 18, wherein the taper nonlinearly increases in width in the light propagation direction.

20. The apparatus of claim 18, wherein the taper includes a convex curve relative to an axis of the SOA defined by the light propagation direction.

* * * * *